United States Patent
Sogabe et al.

(10) Patent No.: US 6,337,146 B1
(45) Date of Patent: Jan. 8, 2002

(54) HYDROGEN-OCCLUDING LAYERED MATERIAL

(75) Inventors: Kouichi Sogabe; Shousaku Yamanaka; Yoshinobu Takeda; Nozomu Kawabe; Hideo Itozaki; Akira Nakayama; Takashi Uemura, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/762,426
(22) PCT Filed: Jun. 7, 2000
(86) PCT No.: PCT/JP00/03709
§ 371 Date: Feb. 6, 2001
§ 102(e) Date: Feb. 6, 2001
(87) PCT Pub. No.: WO00/77266
PCT Pub. Date: Dec. 21, 2000

(30) Foreign Application Priority Data

Jun. 11, 1999 (JP) .......................................... 11/165890

(51) Int. Cl.$^7$ .............................................. B32B 15/00
(52) U.S. Cl. ....................... 428/649; 428/635; 428/656; 428/663; 428/678; 428/681; 428/450
(58) Field of Search ................................ 428/649, 635, 428/656, 663, 678, 681, 450; 420/900

(56) References Cited

FOREIGN PATENT DOCUMENTS

| JP | 51148634 | 12/1976 |
|----|----------|---------|
| JP | 62191402 | 8/1987 |
| JP | 01131001 | 5/1989 |
| JP | 07041808 | 2/1995 |
| JP | 09059001 | 3/1997 |

OTHER PUBLICATIONS

New Development of Hydrogen Storage Alloy—Improved Performance with Nano–Composition Technology–; Boundary 1996.4; pp. 36 to 41; vol. 12, No. 4, by O. Moichi et al. (No Month Given).

Primary Examiner—Robert R. Koehler
(74) Attorney, Agent, or Firm—W. F. Fasse; W. G. Fasse

(57) ABSTRACT

A hydrogen storage laminated material can be obtained which is capable of achieving reduction in weight as well as being mass-produced industrially while assuring excellent hydrogen storage capability. The hydrogen storage laminated material (10) has a laminated structure of a first layer (6a) and a second layer (7a), wherein the first layer is formed from an alloy or compound including an element of a group 2A or 3A or an element of at least one of the groups 2A and 3A, and at least partially includes a bcc structure, and the second layer is formed from an alloy or compound including an element of one of groups 6A, 7A and 8A or an element of at least one of the groups 6A, 7A and 8A.

6 Claims, 3 Drawing Sheets

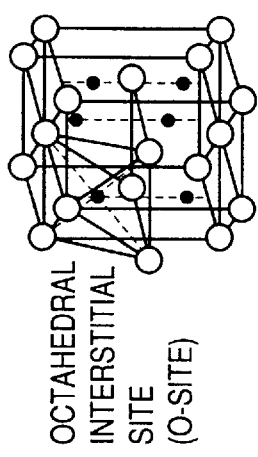

FIG. 4A

OCTAHEDRAL INTERSTITIAL SITE (O-SITE)

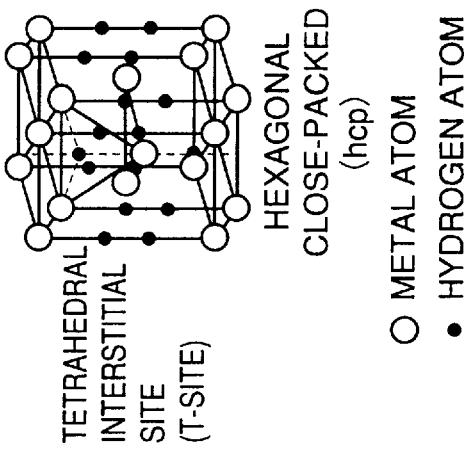

FIG. 4B

TETRAHEDRAL INTERSTITIAL SITE (T-SITE)

FACE-CENTERED CUBIC LATTICE (fcc)

○ METAL ATOM
● HYDROGEN ATOM

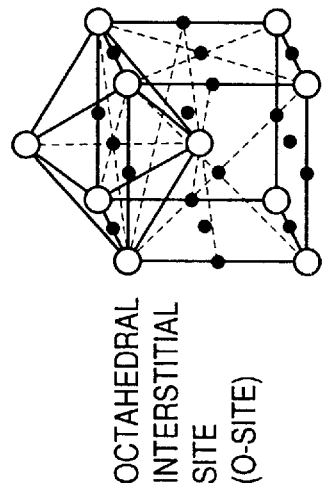

FIG. 5A

OCTAHEDRAL INTERSTITIAL SITE (O-SITE)

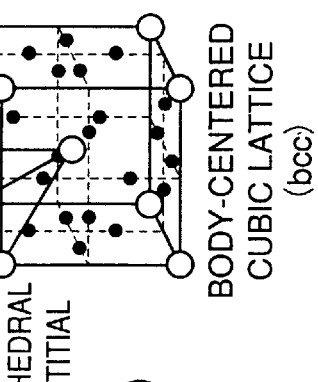

FIG. 5B

TETRAHEDRAL INTERSTITIAL SITE (T-SITE)

BODY-CENTERED CUBIC LATTICE (bcc)

○ METAL ATOM
● HYDROGEN ATOM

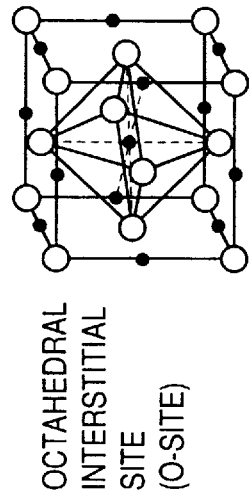

FIG. 6A

OCTAHEDRAL INTERSTITIAL SITE (O-SITE)

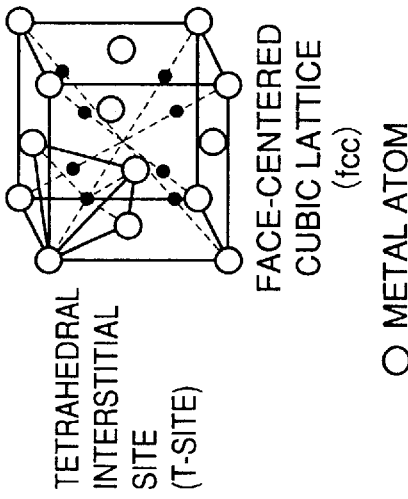

FIG. 6B

TETRAHEDRAL INTERSTITIAL SITE (T-SITE)

HEXAGONAL CLOSE-PACKED (hcp)

○ METAL ATOM
● HYDROGEN ATOM

HYDROGEN-OCCLUDING LAYERED MATERIAL

English Translation of PCT/JP00/03709 filed Jun. 7, 2000.

DESCRIPTION

Hydrogen Storage Laminated Material

1. Technical Field

The present invention relates to a hydrogen storage laminated material, and more particularly, relates to a hydrogen storage laminated material having excellent hydrogen storage capability.

2. Background Art

With growing interest in hydrogen energy systems in recent years, research and development of materials of the metallic alloys for hydrogen storage have been actively conducted searching for materials for use as a hydrogen storage and transport medium, or for use in energy conversion, separation and refinement of hydrogen gas, and the like. The most important property as the metallic alloys for hydrogen storage is excellent hydrogen storage capability. In the conventional materials, the atom ratio of stored hydrogen to metal (H/M) is as follows: H/M=1.00 for $LaNi_5$ and $CaNi_5$; H/M=1.33 for $Mg_2Ni$; and H/M=1.50 for $ZrV_2$.

In the case where the hydrogen storage material is a massive (bulk) state, the hydrogen storage material is pulverized as a result of repeated hydrogen absorption-desorption cycles. This pulverization significantly hinders the practical use as a hydrogen storage material. Therefore, attempts have been made to form the hydrogen storage material into a thin film that is less susceptible to pulverization. However, the hydrogen absorption amount is reduced as compared to the massive sample. Moreover, in order to use the hydrogen storage material for the electrode materials of the nickel-hydrogen secondary batteries or the like, development of a material having H/M=1.50 or more as a standard of the hydrogen absorption amount has been expected.

Then, in order to solve these problems, a technology was disclosed in which the hydrogen storage capability is improved by a laminated structure of Ti having an hcp structure (group 4A metal, alloy, compound) and Cr having a bcc structure (group 6A, 7A, 8A metal, alloy, compound) (Japanese Laid-Open Publication No. 9-59001). A material having this laminated structure allows for significant improvement in the hydrogen storage capability.

According to the above-mentioned laminated material, H/M of 1.5 or more can be easily achieved, and under the good conditions, H/M of about 3.0 is also possible. However, the following problems arise when the above-mentioned elements are used:

1) A relatively expensive metal is used. Ti is relatively commonly used, but is restricted in terms of resources, and therefore becomes expensive when used in applications such as batteries. In other words, utilization in large quantities is difficult industrially.

2) The weight is increased. The increased weight is highly disadvantageous for portable use or the like.

It is an object of the present invention to provide a hydrogen storage laminated material having an increased H/M value and capable of achieving reduction in weight and of being mass-produced industrially.

DISCLOSURE OF INVENTION

A hydrogen storage laminated material of the present invention has a laminated structure of first and second layers, wherein the first layer is formed from an alloy or compound including an element of a group 2A or 3A or an element of at least one of the groups 2A and 3A, and at least partially includes a body-centered cubic structure, and the second layer is formed from an alloy or compound including an element of one of groups 6A, 7A and 8A or an element of at least one of the groups 6A, 7A and 8A.

The inventors have confirmed for the first time that a laminated structure that is durable as an industrial material can be obtained by laminating a layer having an element of the group 2A, 3A and a layer having an element of the group 6A, 7A, 8A, and that this laminated structure is light in weight and also has excellent hydrogen storage capability. In the above-mentioned laminated material, significant reduction in weight can be realized as compared to the hydrogen storage laminated material described in the above-mentioned Japanese Laid-Open Publication No. 9-59001. Thus, this laminated material can be made highly suitable as a main member of an apparatus intended to be used in, e.g., applications in which rich resources as well as lightness in weight are of great importance. In other words, this laminated material can be made highly suitable as a hydrogen supply source for the hydrogen-utilizing fuel cells, a portable or mobile hydrogen source, or a small hydrogen supply source provided inside and outside the houses, business offices and the like, and thus, can be used as a safe, hydrogen-utilizing power supply or heat source.

The group 2A element or group 3A element included in the first layer of this laminated structure generally has a hexagonal close-packed (hcp) structure at ordinary temperature and pressure, but the above-mentioned laminated structure at least partially includes a bcc structure. The reason why the first layer including the bcc structure has the increased hydrogen storage capacity can be considered as follows: unlike the conventional idea, in the case where the first layer is changed to a crystal of the bcc structure including an element of at least one of the groups 2A and 3A, the number of interstitial sites capable of being occupied by hydrogen atoms is increased to at most nine per atom of the group 2A or 3A element, as shown in FIGS. 4A to 6B. Moreover, since it is possible to control the interatomic distance of the first layer by changing the interatomic distance and constituent element of the second layer, the bonding power between the group 2A or 3A element and hydrogen as well as the size of the hydrogen atom itself can be changed. Thus, hydrogen's moving speed and moving capability inside the crystal, as well as the bonding power acting on the hydrogen atoms inside the crystal can be adjusted, whereby the number of hydrogen atoms capable of being stored per constituent atom of the first layer can be increased to at most nine. Furthermore, since it is possible to control movement and diffusion of hydrogen, a material capable of easily performing hydrogen absorption and desorption at 100° C. or less, and preferably 80° C. or less, can be made.

Since the above-mentioned hydrogen storage laminated material of the present invention has such a multi-layer film structure, the hydrogen storage capacity that is significantly superior to that of the conventional bulk hydrogen storage materials can be obtained.

The hydrogen storage laminated material of the present invention can be obtained by laminating two different kinds of substances onto a substrate using, e.g., a vapor phase method like a PVD (Physical Vapor Deposition) method such as vacuum deposition method, ion plating method and sputtering method, and a CVD (Chemical Vapor Deposition) method such as plasma CVD method. In addition to the method as described earlier, in the case where the physical vapor deposition or chemical vapor deposition is conducted in the atmosphere in which high-purity hydrogen gas is present, the bond distance between atoms is increased as compared to the case where hydrogen is not present, whereby the hydrogen storage capability is increased. This is desirably conducted at the hydrogen gas pressure of 1 atm or less, and preferably, in the reduced-pressure hydrogen atmosphere of 0.1 atm or less. Although the effect of the hydrogen gas is not clear, the reason for this can be considered as follows: the hydrogen atoms are taken in simultaneously with formation of the laminated structure, so that the bond distance between the metal atoms resulting from the taking in of the hydrogen atoms is automatically controlled to such a distance that is preferable for taking in and out of hydrogen.

The following consideration is also possible: for example, a change in the electron structure due to increase in the interface (increase in the number of interfaces) or increase in the number of interface atoms resulting from a reduced lamination cycle length of the first and second layers may be involved in the increased hydrogen storage capacity. Therefore, in a preferred aspect of the present invention, the lamination cycle, that is, the length of a unit lamination including the first and second layers is repeatedly laminated.

By thus laminating the lamination structure repeatedly, the hydrogen storage capability can further be improved.

Moreover, in a preferred aspect of the present invention, the second layer is formed from a material having a bulk modulus that is larger than that of the first layer.

By laminating a layer including a group 6A, 7A, 8A element, which has a bcc structure at the ordinary temperature and pressure and also has a larger bulk modulus than a layer including a group 2A or 3A element, and the layer including a group 2A or 3A element, a bcc structure becomes likely to be produced in the first layer. In other words, a metal or the like forming the first layer and having an hop structure at the ordinary temperature and pressure is subjected to elastic deformation at the interface with the second layer due to the high bulk modulus of the second layer, and becomes susceptible to phase transition to the bcc structure at the interface or in the inside of the first layer.

Moreover, in the above-mentioned hydrogen storage laminated material, it is desirable that the laminated material has lattice distortion produced therein.

With the lattice distortion produced in the laminated material, the bcc structure is likely to be produced within the first layer, and particularly at the interface. As a result, the hydrogen storage capability can be improved.

More desirably, in the above-mentioned hydrogen storage laminated material, the first layer includes a group 2A element, Mg, as a main element.

Mg has small specific gravity, and therefore is highly advantageous for reduction in weight. Mg is also rich in resources, and is suitable for industrial mass production. Accordingly, the hydrogen storage laminated material can be used in large quantities in applications in which a reduced weight is important, while maintaining high hydrogen storage capability.

In the above-mentioned hydrogen storage laminated material, it is highly desirable that the second layer includes a group 8A element, Fe, as a main element.

Fe is outstanding as an inexpensive industrial material. The hydrogen storage laminated material using Fe can be mass-produced at low cost, and therefore can be made highly suitable as an electrode material for the nickel-hydrogen secondary batteries, a hydrogen supply source for the hydrogen-utilizing fuel cells, a portable or mobile hydrogen source, or a small hydrogen supply source provided inside and outside the houses, business offices and the like. As a result, this hydrogen storage laminated material can be advantageously used as a new, alternative energy source to the fossil fuel. In particular, combination with a multi-layer material including Mg as a main element in the first layer meets weight and economical requirements, and therefore is highly desirable.

BRIEF DESCRIPTION OF DRAWINGS

FIGS. 4A and 4B are diagrams showing the sites of hydrogen atoms in an fcc lattice. FIG. 4A is a diagram showing octahedral interstitial sites (O-sites), and FIG. 4B is a diagram showing tetrahedral interstitial sites (T-sites).

FIGS. 5A and 5B are diagrams showing the sites of hydrogen atoms in a bcc lattice. FIG. 5A is a diagram showing octahedral interstitial sites (O-sites), and FIG. 5B is a diagram showing tetrahedral interstitial sites (T-sites).

FIGS. 6A and 6B are diagrams showing the sites of hydrogen atoms in an hcp lattice. FIG. 6A is a diagram showing octahedral interstitial sites (O-sites), and FIG. 6B is a diagram showing tetrahedral interstitial sites (T-sites).

BEST MODE FOR CARRYING OUT THE INVENTION

Hereinafter, a laminated structure formed by an ion plating method will be described as one embodiment of the present invention. Any one of the group 2A elements Be, Mg, Ba, Ca and the group 3A elements Y, La, Yb was used as a metal element forming a first layer, and a group 6A element, Cr, or a group 8A element, Ni, was used as an element forming a second layer.

A laminated film of the first and second layers was formed by the ion plating method using vacuum arc discharge. In this case, Cr or Ni forming the second layer has a bulk modulus that is larger than that of the above-mentioned element forming the first layer. A specific method for making this multi-layer film is described in conjunction with FIG. 1.

Figure 1:
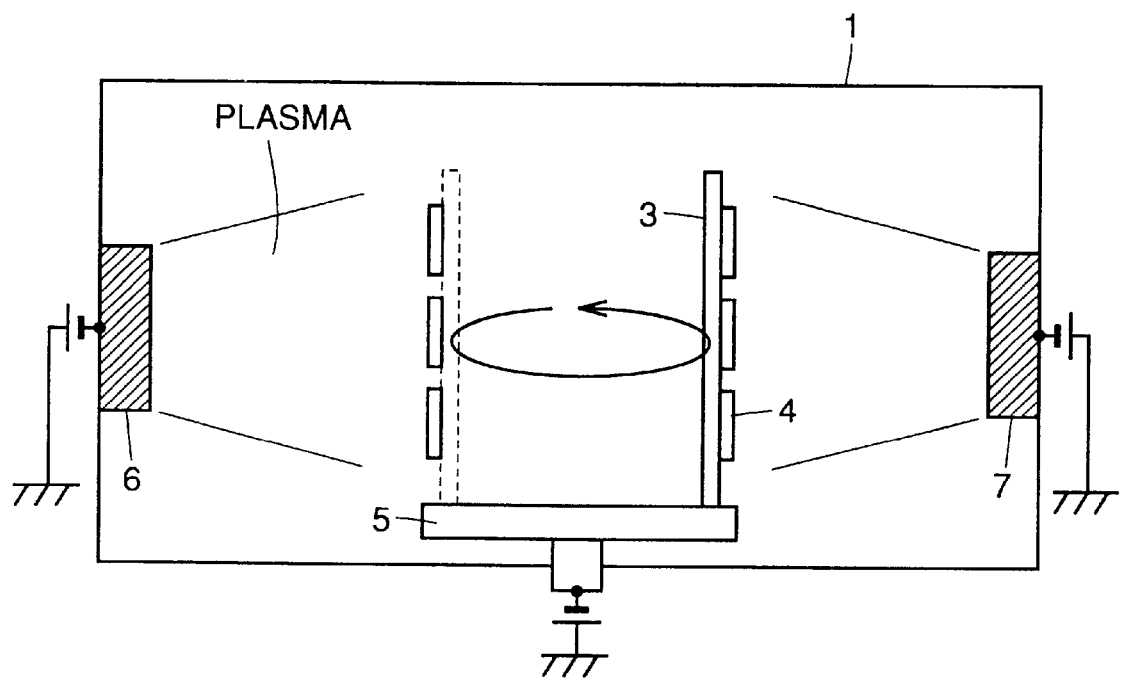
FIG. 1 is an external view showing the process of a film forming apparatus.

FIG. 1 is an external view showing the structure of a film forming apparatus. Referring to FIG. 1, cathode evaporation materials (evaporation sources 6 and 7) of the elements forming the first and second layers are disposed in a vacuum vessel 1, and a substrate 4 is mounted onto a substrate holder 3 provided on a rotary table 5. The substrate 4 is formed from, for example, silicon. After sufficient evacuation, the rotary table 5 is rotated while evaporating the cathode evaporation materials by arc discharge in vacuum or in the atmosphere of argon gas. Thus, the element forming the first layer is formed into a film on the substrate when it faces the evaporation source 6 of the first layer, whereas the element forming the second layer is formed into a film when facing the evaporation source 7 of the second layer.

The respective thicknesses (lamination cycle) of the first and second layers were adjusted by controlling the rotational speed of the rotary table 5. An example of the typical conditions for making the laminated structure using various elements is as shown in Table 1 below:

TABLE 1

| | | | |
|---|---|---|---|
| Arc Current (First Layer) | 80 A | Substrate Bias | −50 V |
| Arc Current (Second Layer) | 80 A | Substrate | Si |
| Film-Forming Pressure (Torr) | ≦0.01 mTorr | Table Rotational Speed | 1–30 rpm |

From the above Table 1, in the typical example, the respective arc currents of the evaporation source 6 of the first layer and the evaporation source 7 of the second layer were 80A each; the film-forming pressure was 0.01 mTorr or less; the substrate bias was −50 V; and the rotational speed of the table was 1 to 30 rpm.

Figure 2:
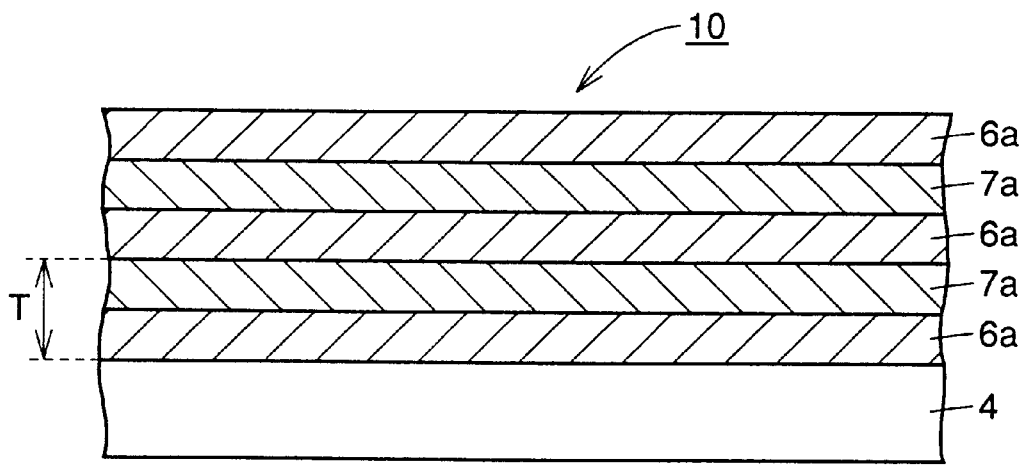
FIG. 2 is a cross sectional view schematically showing the structure of a laminated film in an embodiment of the present invention.

FIG. 2 shows a cross sectional view of the laminated film of the first and second layers thus obtained.

Referring to FIG. 2, for example, a Be layer 6a and a Cr layer 7a are successively repeatedly laminated on the silicon substrate 4 to form a laminated film 10. In FIG. 2, T denotes the thickness (nm) of the lamination cycle.

The above-mentioned laminated film was subjected to hydrogen storage treatment by an electrolytic charge method. An apparatus for conducting the hydrogen storage treatment is shown in FIG. 3.

Figure 3:
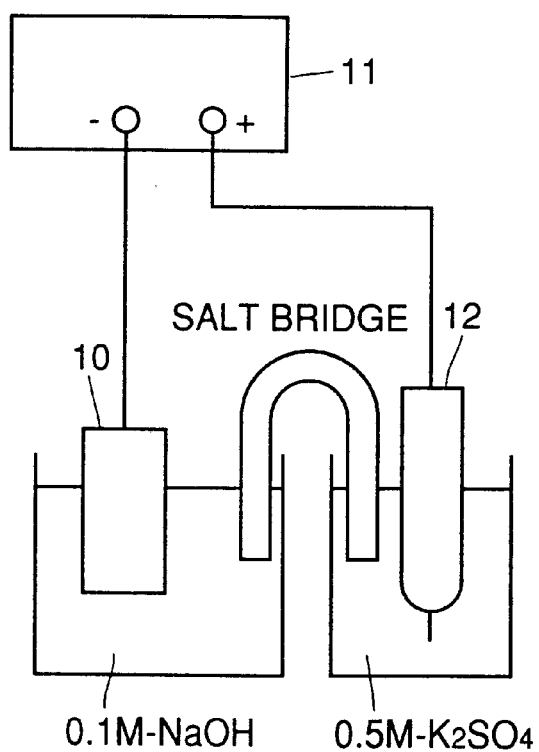
FIG. 3 is a schematic diagram showing the structure of an apparatus for realizing hydrogen storage treatment.

Referring to FIG. 3, in conducting the hydrogen storage, the sample 10 shown in FIG. 2 was soaked in a 0.1 M−NaOH solution and a Pt counter electrode 12 was soaked in a 0.5 M—$K_2SO_4$ solution. A negative current was applied to the sample 10, whereas a positive current was applied to the Pt counter electrode 12, both for a predetermined time period by means of a constant-current power supply 11. TR6120A made by Advantest was used as the constant-current power supply 11. Note that the current value was basically 10 mA, and the current application time was set to one hour. A value as given by current (A)×time (s) corresponds to the quantity of electricity, and this value was used to calculate the hydrogen generation amount by the electrolysis (Faraday's law). The hydrogen charge conditions were common to all the laminated materials. Measurement of stored hydrogen was conducted with EMGA621 made by Horiba. This apparatus is capable of conducting any one of hydrogen absolute quantity analysis and temperature-programmed analysis.

Present Examples Nos. 1 to 16 and Comparative Examples 25 to 30 as shown in Table 2 below were subjected to the above-mentioned hydrogen storage treatment. The result is shown in Table 2.

TABLE 2

| | | Material Combination | Lamination Cycle (nm) | Hydrogen Storage Capacity (H/M) | XRD Peak Showing bcc Structure | Lattice Distortion |
|---|---|---|---|---|---|---|
| Present Example | 1 | Be/Cr | 5 | 2.0 | Exist | Exist |
| | 2 | Be/Ni | 5 | 2.5 | Exist | Exist |
| | 3 | Mg/Ni | 5 | 2.5 | Exist | Exist |
| | 4 | Mg/Cr | 5 | 2.5 | Exist | Exist |
| | 5 | Ba/Ni | 5 | 2.0 | Exist | Exist |
| | 6 | Ba/Cr | 5 | 2.5 | Exist | Exist |
| | 7 | Y/Ni | 5 | 3.0 | Exist | Exist |
| | 8 | Y/Cr | 5 | 3.0 | Exist | Exist |
| | 9 | La/Ni | 5 | 3.0 | Exist | Exist |
| | 10 | La/Cr | 5 | 3.0 | Exist | Exist |
| | 11 | Yb/Ni | 5 | 2.5 | Exist | Exist |
| | 12 | Yb/Cr | 5 | 2.5 | Exist | Exist |
| | 13 | Ca/Ni | 5 | 2.5 | Exist | Exist |
| | 14 | Ca/Ni | 50 | 1.5 | Exist | Exist |
| | 15 | Ca/Cr | 5 | 2.5 | Exist | Exist |
| | 16 | Ca/Cr | 50 | 1.5 | Exist | Exist |
| Comparative Example | 25 | $BeNi_5$ | — | 1.0 | None | — |
| | 26 | $MgNi_5$ | — | 1.5 | None | — |
| | 27 | $CaNi_5$ | — | 1.0 | None | — |
| | 28 | $LaNi_5$ | — | 1.0 | None | — |
| | 29 | $BeCr_5$ | — | 1.0 | None | — |
| | 30 | $LaCr_5$ | — | 0.5 | None | — |

Lattice Distortion: a lattice constant was calculated from an XRD peak showing bcc, and presence/absence of distortion was determined from comparison with a lattice constant of Cr or Ni.

Note that, in Present Examples 1 to 16, two lamination cycles (T in FIG. 2) of 5 and 50 nm were used, and the element of the second layer is limited to Cr (group 6A) or Ni (group 8A) while changing the element of the first layer among the group 2A elements Be, Mg, Ba, Ca and the group 3A elements Y, La, Yb. Moreover, bulk materials (single-layer structure) of $BeNi_5$, $MgNi_5$, $CaNi_5$, $LaNi_5$, $BeCr_5$ and $LaCr_5$ were used as Comparative Examples 25 to 30. Presence/absence of a diffraction peak of X-ray diffraction due to a bcc structure from the first layer is also shown in Table 2.

Note that, specifically, the hydrogen storage capacity was obtained by the following method:

First, the film (or laminated film) is warmed up, and hydrogen leaving the film is quantified by gas analysis. Subsequently, the film having discharged hydrogen is dissolved in acid, and the film atoms are quantified by chemical analysis. H/M was obtained from both results. Here, in Table 2, presence/absence of lattice distortion was determined from comparison between a lattice constant of a bcc structure produced in the first layer and a lattice constant of a bcc structure of the second layer. With the lattice distortion being present, the first layer is subjected to elastic deformation at the interface due to the metal or the like forming the second layer having a high bulk modulus, and thus is forced to have a bcc structure.

The result of Table 2 shows that, by laminating the above-mentioned combinations of the elements, the laminated material according to the present invention has hydrogen storage capability that is significantly higher than that of the conventional bulk materials. Moreover, it can be appreciated that the laminated material of the present invention is lighter in weight than any one of the conventional hydrogen storage materials regardless of whether it is a bulk material or laminated material, and is capable of being mass-produced industrially. Accordingly, the laminated material can be made highly suitable as a hydrogen supply source for the hydrogen-utilizing fuel cells, a portable or mobile hydrogen source, or a small hydrogen supply source provided inside and outside the houses, business offices and the like, and thus, can be used as a safe, hydrogen utilizing power supply or heat source.

Then, the laminated materials were also tested in which the element forming the first layer is limited to Mg or Ca while changing the element forming the second layer among Mo, Mn, Fe and W. More specifically, samples 51 to 58 were made by the same method as that of Table 2, and were caused to store hydrogen by the hydrogen storage method shown in FIG. 3 and then examined for the hydrogen storage capacity. The result is shown in Table 3.

The result of Table 3 shows that a layer including Ca (group 2A) or Mg (group 2A), which enables significant reduction in weight, can be used as the first layer. Moreover, Ca or Mg is rich in resources, and can be mass-produced industrially. Regarding the hydrogen storage capability, it can be appreciated that lamination of a layer including Ca or Mg and a layer of any one metal element of the groups 6A, 7A and 8A results in highly excellent hydrogen storage capability, as shown in Table 3. All the samples of Table 3 have HIM of 2 or more, which is well beyond 1.50, the value required for the electrodes of the nickel-hydrogen secondary batteries, and therefore meet the weight and economical requirements. These results have enabled an electrode material of the nickel-hydrogen secondary batteries which is inexpensive and capable of being supplied in large quantities to be realized in applications in which a reduced weight is important.

Note that it can be readily supposed that the laminated material is not necessarily formed from a single element, and the same effects can be expected from a compound, alloy, or the like. However, the above results of Tables 2 and 3 show that the hydrogen storage capacity that is superior to that of the conventional materials can be obtained even by merely laminating a layer including an element of the group 2A or 3A and a layer including an element of the group 6A, 7A, 8A.

The hydrogen storage laminated material according to the present invention has a laminated structure of two or more different kinds of substances, wherein one layer thereof is formed from a substance including an element of the group 2A or 3A and at least partially includes a bcc structure, and the other layer is formed from a substance including at least one element of the group 6A, 7A and 8A. By using this hydrogen storage laminated material, significant reduction in weight as well as industrial mass production as compared to the conventional hydrogen storage materials can be achieved while assuring high hydrogen storage capability. Moreover, the hydrogen storage laminated material of the present invention can be made highly suitable as a high-sensitive hydrogen sensor, and also as a hydrogen supply source for the hydrogen-utilizing fuel cells, a portable or mobile hydrogen source, or a small hydrogen supply source provided inside and outside the houses, business offices and the like, and thus, can be used as a safe, hydrogen-utilizing power supply or heat source.

The embodiments as disclosed herein are by way of illustration and example only in every respect, and are not to be taken by way of limitation. The scope of the present invention is defined by the appended claims rather than the above description, and includes all modifications within the sense and scope equivalent to the definition of the appended claims.

What is claimed:

1. A hydrogen storage laminated material, wherein
   the hydrogen storage laminated material has a laminated structure of a first layer (6a) and a second layer (7a),
   the first layer is formed from an alloy or compound including an element of a group 2A or 3A or an element of at least one of the groups 2A and 3A, and at least partially includes a body-centered cubic structure, and
   the second layer is formed from an alloy or compound including an element of one of groups 6A, 7A and 8A or an element of at least one of the groups 6A, 7A and 8A.

2. The hydrogen storage laminated material according to claim 1, wherein a lamination cycle including the first and second layers is repeatedly laminated.

TABLE 3

|  |  | Material Combination | Lamination Cycle (nm) | Hydrogen Storage Capacity (H/M) | XRD Peak Showing bcc Structure | Lattice Distortion |
| --- | --- | --- | --- | --- | --- | --- |
| Present Example | 51 | Ca/Mo | 5 | 2.5 | Exist | Exist |
|  | 52 | Ca/Mn | 5 | 2.5 | Exist | Exist |
|  | 53 | Ca/Fe | 5 | 2.5 | Exist | Exist |
|  | 54 | Ca/W | 5 | 2.0 | Exist | Exist |
|  | 55 | Mg/Mo | 5 | 2.5 | Exist | Exist |
|  | 56 | Mg/Mn | 5 | 2.5 | Exist | Exist |
|  | 57 | Mg/Fe | 5 | 2.0 | None | Exist |
|  | 58 | Mg/W | 5 | 2.5 | Exist | Exist |

3. The hydrogen storage laminated material according to claim 1, wherein the second layer is formed from a material having a bulk modulus that is larger than that of the first layer.

4. The hydrogen storage laminated material according to claim 1, wherein the laminated material has lattice distortion produced therein.

5. The hydrogen storage laminated material according to claim 1, wherein the first layer includes a group 2A element, Mg, as a main element.

6. The hydrogen storage laminated material according to claim 1, wherein the second layer includes a group 8A element, Fe, as a main element.

* * * * *

UNITED STATES PATENT AND TRADEMARK OFFICE
CERTIFICATE OF CORRECTION

PATENT NO. : 6,337,146 B1
DATED : January 8, 2002
INVENTOR(S) : Sogabe et al.

It is certified that error appears in the above-identified patent and that said Letters Patent is hereby corrected as shown below:

<u>Title page, Item [54] and Column 1, lines 1-5,</u>
Replace the title to read as follows:
-- HYDROGEN STORAGE LAMINATED MATERIAL --.

<u>Column 1,</u>
Line 8, before "Technical", delete "1.";
Line 13, before "Background Art", delete "2.";
Line 25, after "H/M=1/33", replace "Mg2Ni" by -- $Mg_2Ni$ --.

<u>Column 4,</u>
Line 67, after "Table", replace "1below:" by -- 1 below: --.

<u>Column 7,</u>
Line 29, after "have", replace "HIM" by -- H/M --.

Signed and Sealed this

Twenty-fifth Day of March, 2003

JAMES E. ROGAN
*Director of the United States Patent and Trademark Office*